Figure 1:
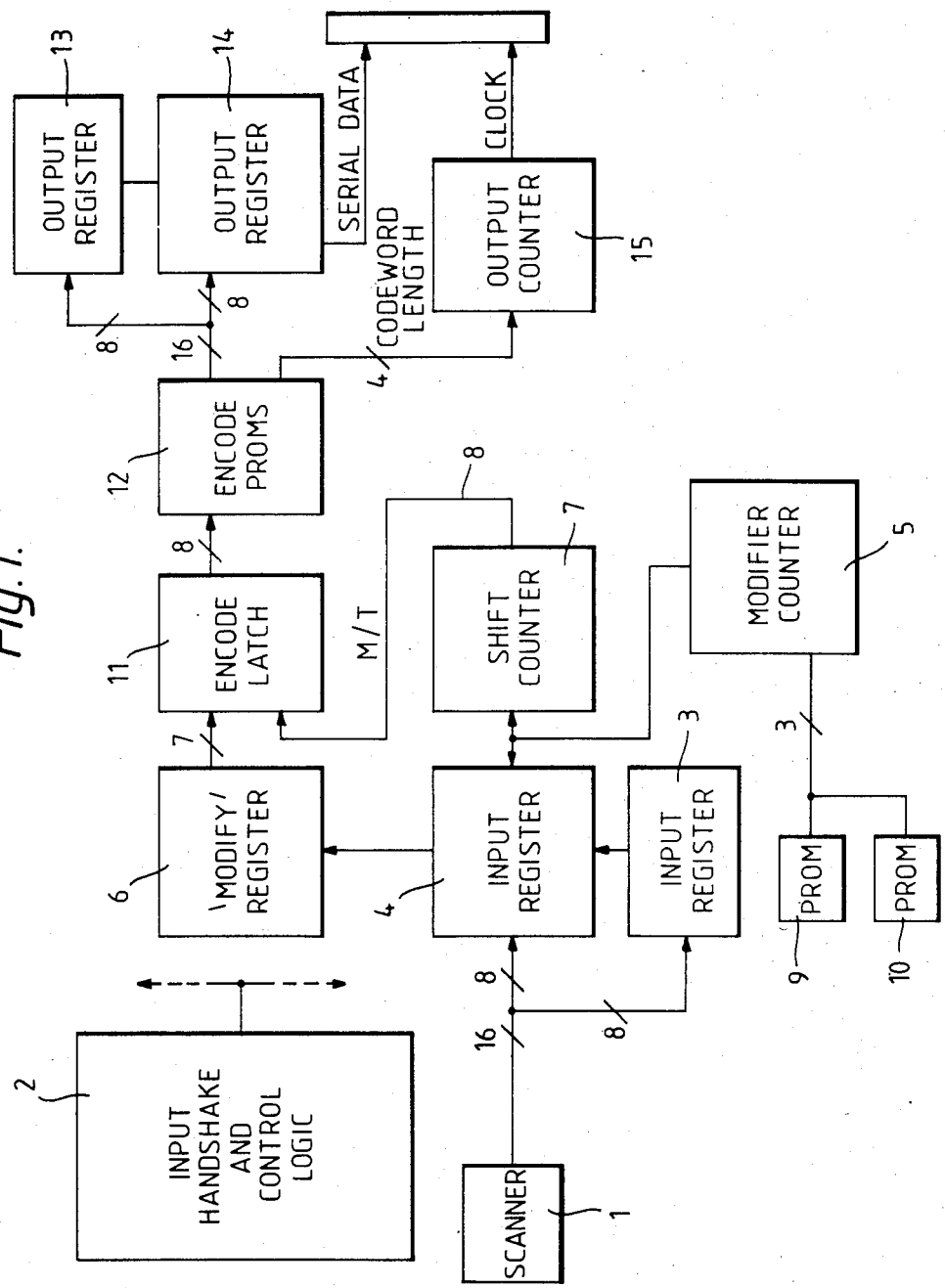

United States Patent [19]

Ross et al.

[11] Patent Number: 4,618,846
[45] Date of Patent: Oct. 21, 1986

[54] DATA CODING

[75] Inventors: Peter F. Ross; Ian W. Rodgers; Rupert L. Goodings, all of Cambridge, England

[73] Assignee: Crosfield Electronics Limited, London, England

[21] Appl. No.: 680,028

[22] Filed: Dec. 10, 1984

[30] Foreign Application Priority Data

Dec. 8, 1983 [GB] United Kingdom ............... 83 32771

[51] Int. Cl.$^4$ ........................................... H03M 7/46
[52] U.S. Cl. .............................. 340/347 DD; 358/261
[58] Field of Search ............... 340/347 DD; 358/260, 358/261

[56] References Cited

U.S. PATENT DOCUMENTS 4,542,413 9/1985 Rallapalli ........................... 358/261

FOREIGN PATENT DOCUMENTS 0079565 6/1980 Japan .................................. 358/261
0170280 10/1983 Japan .................................. 358/261

Primary Examiner—Charles D. Miller
Attorney, Agent, or Firm—Sughrue, Mion, Zinn, Macpeak and Seas

[57] ABSTRACT

A method and apparatus for coding signals representing a stream of digital data groups (for example run lengths) for transmission or storage, each group representing a numerical quantity, is described. The signals are supplied via input and modify registers (4,6) and an encode latch (11) to a set of encode PROMs (12). The PROMs (12) generate for each data group a code representing the group, the code comprising a terminator codeword and, where necessary, one or more make-up codewords. The codewords are based on one or more multiplicative modifiers. The codewords are fed in parallel to output registers (13,14) and then serially shifted out of the output registers for subsequent transmission, storage, or further processing.

10 Claims, 2 Drawing Figures

DATA CODING

The invention relates to methods and apparatus for coding data for transmission or storage and for decoding such coded data. The invention is particularly concerned with the transmission and storage of data representing picture information.

Conventionally, picture information is reduced to digital form for storage or transmission by optically scanning the original picture line by line. This scanning process notionally divides each line into a large number of pixels and allots a binary digit to each pixel. If the picture is coloured the digit might represent the tonal value of a colour separation (conventionally cyan, yellow, magenta or black) and three or four bits would be necessary to digitise each pixel. If alternatively the "picture" such as text is made up of simply two colours, most commonly black and white as in the case of a newspaper page, the digit only needs to indicate whether the pixel is mainly black or mainly white, and a single bit is sufficient for each pixel.

In the first example, a number of streams of data are produced, each stream of digital data representing a particular colour separation whereas in the second case only a single stream of data will be produced. Analysis of these streams of data reveals that each stream comprises a number of run lengths of digits which are the same and thus represent adjacent parts of a line of the original picture which have the same colour component. This information has been used in the past in order to reduce the amount of storage required for the digital information and to decrease the transmission time where the information is to be transmitted to a remote receiving station. In its most primitive form this has involved transmitting or storing a sequence of data representing the number of a particular type of digit in successive run lengths e.g the number of "0" or "1" bits in the case of binary data.

This very simple form of coding, known as run length encoding, presents problems. The coded data is stored or transmitted as a continuous stream of binary digits and so some marker must be included to divide the data into its separate run lengths. In order to overcome this particular problem, it is the practice to code the run length data using a code system in which each codeword representing a run of a particular length is unique and has the property that no short codeword forms the prefix of a longer codeword. This enables electronic decoding techniques to be used. One example of such a code system is that devised by Huffman and described in the Proceedings of the I.R.E. of September 1952, pages 1098–1101. In the Huffman code system, the codewords have the additional property that short codewords are assigned to relatively frequently occurring run lengths while longer codewords are assigned to relatively rare run lengths.

One of the problems with code systems having these properties is that for many run lengths, very long codewords are required. An attempt at solving this problem has been made in which a run length has been coded in two parts namely a terminator codeword and a make-up codeword. One example of such a system is the so-called modified Huffman (MH) coding system in which one scanning line of an A4 size short side is divided into 1728 pixels. In this system, a unique terminator codeword is assigned to run lengths of 0 to 63 bits, while for run lengths which are integral multiples of 64 up to 1728 one of a number of make-up codewords is assigned additionally.

This system has a number of drawbacks. Firstly, there is a practical limit to the number of make-up codewords which can be provided since a large number of such codewords will require a great deal of memory in the decoding systems. Secondly, the size of the codewords needed to maintain the properties of the code system mentioned above rapidly increases, again leading to the requirement of a large memory in a decoding system and to an increase in processing time. In practice, where run lengths which exceed the maximum which can be represented by a single make-up codeword and a terminator codeword are encountered, additional make-up codewords have to be used.

More recently, predictive encoding techniques have been developed which try to generate very large run lengths of data indicating that the colour of all pixels in the run have been successfully predicted. See for example U.S. Pat. No. 4,325,085. In this case very long run lengths of the order of 20,000 are not infrequently encountered and this would require the use of many make-up codewords if the MH system was used.

In accordance with a first aspect of the present invention, a method of coding signals representing a stream of digital data groups for transmission or storage, each group representing a numerical quantity, comprises supplying the signals to coding means for generating for each data group a code representing the group, the code comprising a terminator codeword and, where necessary, one or more make-up codewords, characterised in that the terminator codewords and make-up codewords are based on one or more multiplicative modifiers.

In accordance with a second aspect of the present invention, apparatus for coding signals representing a stream of digital data groups for transmission or storage, each group representing a numerical quantity comprises means for supplying the signals to coding means for generating for each data group a code representing the group, the code comprising a terminator codeword and, where necessary, one or more make-up codewords, characterised in that the terminator and make-up codewords are based on one or more multiplicative modifiers.

The invention enables a considerable reduction in the number of codewords required in the code system and thus enables considerable increases in transmission speeds and reductions in storage space. In the case of run length encoding it also enables the length of the codewords for coding any particular run length to be minimised. It is thus particularly suited for use with code systems in which no short codeword forms the prefix of a longer codeword.

In the MH system described previously, additive modifiers are relied on. That is, the terminator and make-up codewords are both based on an additive modifier of 64 and thus to code large run lengths of the order of 20,000 many make-up codewords are required. In contrast to this, with the invention where the codewords are based on multiplicative modifiers, a relatively small number of codewords are required. Clearly, with the invention, the modifiers could be equal to or greater than two but the lower the modifier the more make-up codewords will be required to encode any particular run length.

It is convenient if the same modifier is used for both the terminator and make-up codewords although it is possible for them to be different and indeed there could be more than one second modifier. For ease of processing, the modifiers are preferably each powers of 2.

Since more than one codeword will normally be required for each digital data group, it is preferable if each digital data group is divided into portions corresponding to the respective modifier length, a codeword subsequently being generated for each portion.

The "modifier length" is the number of digits required to represent the modifier.

Typically, the digital data groups will be in binary form and represent run lengths of first and second colours (eg. black and white) in a line of information which has been scanned by scanning means, successive data groups indicating the number of pixels of the first and second colours respectively. Alternatively, the stream of digital data groups could have been derived from carrying out a conventional predictive encoding technique on a scanned original picture or text.

It will be realised that it is necessary to define a zero make-up codeword with the invention. In the prior code systems this was not required since additive modifiers were used. Preferably, therefore, the method further comprises generating a make-up zero codeword to mark the end of a block of codewords. This is possible because a make-up zero code word will not be generated normally directly after a terminator codeword since leading zeros are suppressed.

An end-of-block marker is useful when different predictive encoding techniques are used to encode a continuous stream of data.

The codewords produced may be fed in the form of representative signals to storage means or to transmission means for transmission via conventional media such as cable or satellite to remote receiving stations having decoded means for reproducing the original data groups.

In accordance with a third aspect of the present invention, a method of decoding a series of codewords which have been coded by a method or apparatus in accordance with the first and second aspects of the invention, comprises determining whether each codeword is a terminator codeword or a make-up codeword; and generating for each terminator codeword and associated make-up codeword, if any, the corresponding digital data group, whereby signals representing the original stream of digital data groups are produced.

Where more than one multiplicative modifier is used, the method further comprises determining for each codeword the corresponding multiplicative modifier.

In accordance with a fourth aspect of the present invention apparatus for decoding a series of codewords which have been generated by a method or apparatus in accordance with the first and second aspects of the present invention comprises means for receiving the codewords; means for determining whether a terminator codeword or a make-up codeword has been received; and means for generating for each terminator codeword and associated make-up codeword, if any, the corresponding digital data group, whereby signals representing the original stream of digital data groups are produced.

Where more than one multiplicative modifier is used, the apparatus comprises means for determining the corresponding multiplicative modifier.

Other aspects of this invention are described and claimed in our copending U.S. applications of even date entitled "Detecting Codewords" and "Codeword Decoding".

Figure 2:
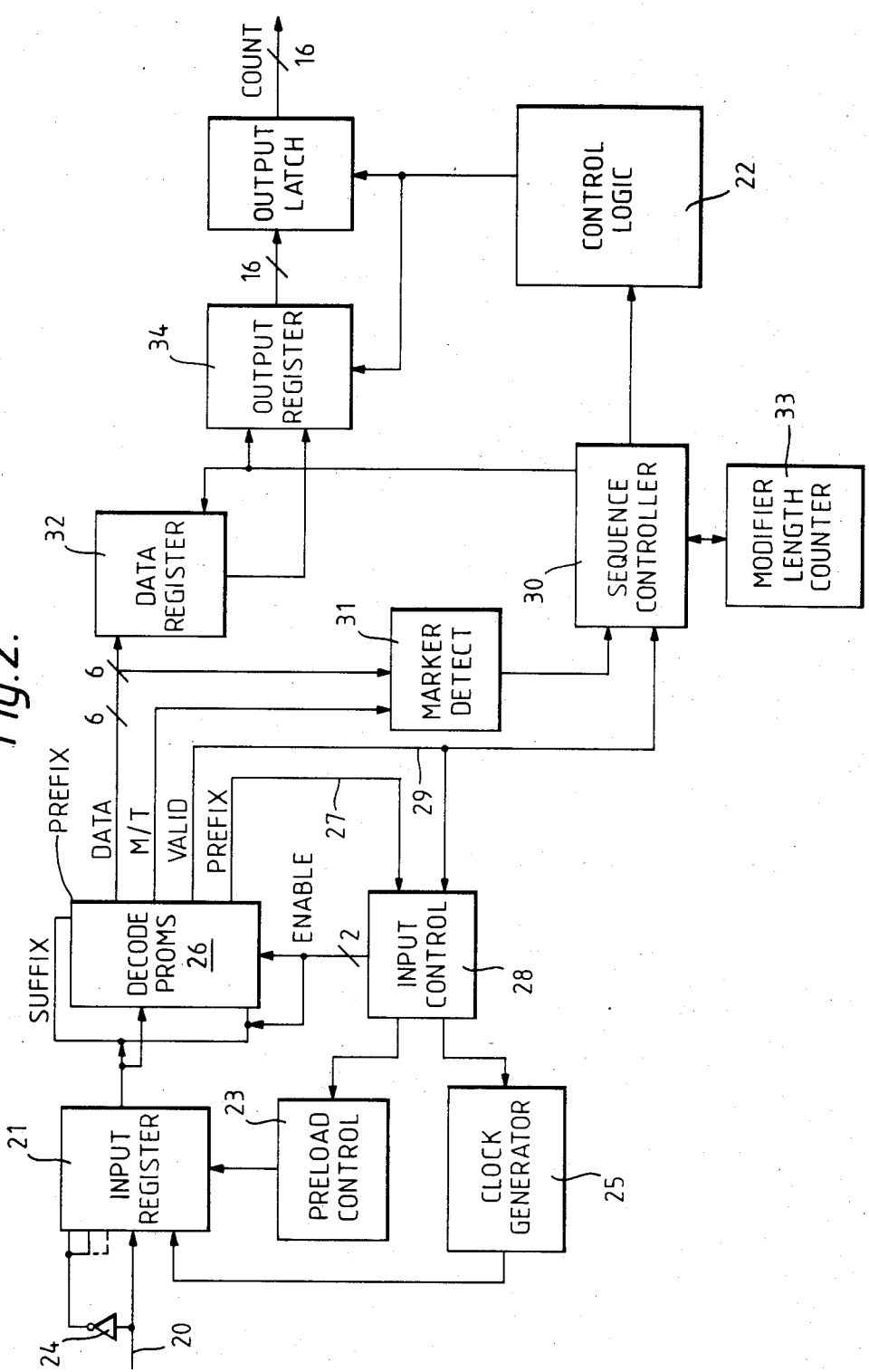

Some examples of methods and apparatus in accordance with the invention will now be described with reference to the accompanying drawing, in which:

FIG. 1 is a block diagram of a circuit for encoding a stream of digital data groups; and, FIG. 2 is a block diagram of a circuit for decoding the codewords generated by the circuit of FIG. 1.

The present invention may best be understood by comparison with the known Modified Huffman system which is more fully described in a document entitled Recommendation T.4—"Standardisation of Group III Facsmilie Apparatus for Document Transmission" published by the CCITT in 1980. This provides inter alia that an A4 page should be divided into 1728 pixels along a standard scan line length of 215 millimeters. In order to encode text written on an A4 page an MH code system has been devised based on a additive modifier of 64. For example, in order to represent all possible run lengths of white along a scan line the code system has 64 terminator codewords repesenting the run lengths 0–63 and 27 make-up codewords representing successive multiples of decimal 64 up to 1728. A total of 91 codewords. Thus, to represent a run of 130 white pixels requires a make-up codeword representing decimal 128 and a terminator codeword representing decimal 2. Using the MH code system recommended by the CCITT the run length of decimal 130 will be represented by the binary digits defining the two codewords as follows:

$$10010 \quad 0111$$
$$128 + 2 = 130$$

In practice, particularly in the case of white pixels, very large run lengths are encountered. The MH code system described already provides a large number of codewords which can specify a maximum run length of 1791 using a single make-up codeword and a terminator codeword. For larger run lengths produced by scanning lines with more than 1728 pixels it is necessary to use additional make-up codewords in an additive manner. For example, to code a run length of decimal 14041 will require eight make-up codewords each representing decimal 1728, a make-up codeword representing decimal 192 and a terminator codeword representing decimal 25. The resultant codeword contains 85 bits The above analysis indicates in a simple manner the principle behind the known MH code system.

In practice the three codewords will be run together before transmission or storage as a continuous stream of bits. They can be reconstituted into separate codewords because of their property that no short codeword forms the prefix of a longer codeword. Thus by reading the bit stream from the left the codewords can be detected. It should be realised that in practice the run lengths encountered are often considerably greater than 3000 since predictive encoding techniques are commonly used which try to generate very large run lengths indicating the number of pixels whose colour (usually black or white) is successfully predicted. This clearly will require a large number of make-up codewords using the known MH system.

An example of a code system for use with methods and apparatus in accordance with the invention is set out in table below.

TABLE

| CODEWORD TYPE | RUN | PREFIX | SUFFIX |
|---|---|---|---|
| T | 0 | 00001 | |
| T | 1 | 01 | |
| T | 2 | 001 | |
| T | 3 | 100 | |
| T | 4 | 110 | |
| T | 5 | 0001 | |
| T | 6 | 1110 | |
| T | 7 | 1111 | |
| M | 0 | 0000000 | 0001 |
| M | 1 | 101 | |
| M | 2 | 000001 | |
| M | 3 | 0000001 | |
| M | 4 | 0000000 | 1 |
| M | 5 | 0000000 | 01 |
| M | 6 | 0000000 | 0000 |
| M | 7 | 0000000 | 001 |

M and T indicate that the codeword is a make-up codeword or a terminator codeword respectively.

The codewords themselves are in binary form for ease of electrical representation and it will be seen that all the terminator codewords comprise a prefix only while some of the make-up codewords include additionally a suffix.

It should be noted that the prefix of any codeword in the code system is not the same as a complete shorter codeword enabling the codewords to be uniquely identified in a continuous bit stream as previously described.

This code system is based on a multiplicative modifier of eight.

If it is desired to encode a run length of 130, this can be achieved using the code system shown in Table 1 with the following set of codewords:

$$000001 \quad 00000000001 \quad 001$$
$$2 \times 64 + \quad 0 \times 8 \quad + \quad 2 = 130$$

It will be appreciated that the number of codewords needed to express decimal 130 is greater in this case than in the previous case but this disadvantage is insignificant in comparison with the considerable reduction in the total number of codewords (16) in the code system. This reduces the amount of hardware and in particular PROMs required to encode and decode the codewords. In some cases the actual length of the resulting stream of binary digits constituting the codewords will be shorter than in the prior art system.

To complete the comparison with the earlier system, in order to represent decimal 14041 using the code system shown in Table 1 the following codewords are required:

$$0000001 \quad 0000001 \quad 0000001 \quad 0000001 \quad 01$$
$$3 \times 4096 + 3 \times 512 + 3 \times 64 + 3 \times 8 + 1$$

The resultant codeword is 30 bits long.

In the Table it will be seen that there is a codeword representing make-up zero which was used in the first example above. It should be clear, however, from these examples that the use of a leading make-up codeword of zero will never be required and so this provides a useful way in which to indicate the end of a block of codewords. This is achieved by generating the make-up zero codeword directly after a terminator codeword when the normal expectation after a terminator codeword is another terminator codeword or a non-zero make-up codeword.

The system set out in the Table above uses the same modifier (8) for both the terminator codewords and the make-up codewords. This is not necessary, however, and in another example, the terminator codeword may be based on a multiplicative modifier of 10 while the make-up codewords are based on a multiplicative modifier of 4 requiring ten terminator and four make-up codewords. In this example, decimal 97 will be represented by:

$$
\begin{aligned}
2 \times (4 \times 10) &= 80 \\
\text{plus} \quad 1 \times (10) &= 10 \\
\text{plus} \quad 7 &= \underline{\phantom{0}7} \\
&\phantom{=} 97
\end{aligned}
$$

The apparatus illustrated in block form in FIG. 1 comprises a conventional scanning and digital data group generator 1 such as the DATRAX 760 manufactured by Crosfield Data Systems Inc. The generator 1 includes scanning means for scanning pages of information such as test or pictures to generate digital data representing the colour component content of individual pixels of the original being scanned. In the simplest case of black text each pixel could be coded with a binary "1" indicating the pixel is predominently black or a binary "0" indicating that the pixel is predominently non-black. This data is then processed either simply to provide signals representing digital data groups successively indicating run lengths of black and white pixels in the scanned original or preferably in initially processed using a conventional predictive encoding technique from which the digital data groups are produced. The advantage of the predictive encoding technique is that the run lengths depend upon the success of the prediction algorithm used and if the algorithm is good then long run lengths will result. This is the presently preferred system which is currently carried out in the DATRAX 760. In either event, the generator 1 will generate digital data groups comprising 16 bit words representing values of run lengths, the run lengths either being black or white pixel run lengths of the scanned original or success or error run lengths resulting from the predictive encoding technique.

These run length counts in the form of 16 bit words are encoded using the remainder of the circuitry illustrated in FIG. 1 under the control of an input handshake and control logic 2. This control logic will not be described in detail since it simply provides for the correct control of the various registers, counters, and PROMs in the circuitry to ensure that the data passes through the circuitry in an ordered manner.

The 16 bit words are fed in parallel into two 8 bit input shift registers 3, 4.

In order to encode the 16 bit words held in the input registers 3, 4 it is necessary to split the word up into several portions, each corresponding in length to the Modifier Length. For example, where a modifier of 8 is used (as in the Table above) the modifier length will be three since the values that can be coded by one codeword are represented by three binary digits. The modifier length is set in a modifier counter 5 in a manner to be explained below. The logic 2 shifts the 16 bit word in the input registers 3, 4 into an eight bit modify register 6, most significant bit first, in portions corresponding to the modifier length. The modifier counter 5 increments each time a shift occurs until the required modifier length is reached at which point the counter 5 indicates to the control logic 2 that shifting should stop. A four bit shift counter 7 counts the total number of shifts which have occurred for the original 16 bit word bit word and provides an output on a line 8 indicative of whether the data currently in the modify register 6 should be coded as a terminator codeword (T) or a make-up codeword (M).

In the present in example, the original 16 bit word cannot be broken up into portions of equal length because the modifier length is not a factor of 16. To deal with this a pair of PROMs 9, 10 are provided. The PROM 9 contains data representing the modifier length (in this case 1) for the leading portion of the 16 bit word while the PROM 10 contains data representing the modifier length (in this case 3) for the remaining portions of the 16 bit word. The logic 2 causes the modifier counter 5 on the first shift only to receive data from the PROM 9 and to count one shift as constituting a portion of the original word to be encoded while for subsequent shifts the control logic 2 causes the modifier counter 5 to receive data from the PROM 10 and to count up to three shifts. As data is shifted into the modify register 6 from the input register 4, data is also shifted from the input register 3 to the input register 4.

After each portion of data has been shifted from the input register 4 to the modify register 6, the data in the modify register 6 is transferred to an encode latch 11. This transfer is inhibited, however, if a previous data portion held in the encode latch 11 has not yet been encoded or if only zeros have been shifted into the modify register 6. This latter inhibition is to suppress leading zeros in short run lengths. It is also inhibited when the control logic 2 has determined that the last portion of a data word has been shifted out of the input register 4 and transferred to the encode latch 11 indicating that the registers 3, 4 and 6 are "empty". When the shift counter 7 records that 16 shifts have taken place it stops the process and issues a terminator indicator (T) on the line 8 which is latched in the encode latch 11 with the last portion of data. For the other portions of the data word, the counter 7 issues a make-up indicator (M). The data in the encode latch 11 is now applied to a set of encode PROMs 12 which contain the Huffman codes set out in the Table above. Effectively the data in the encode latch 11 addresses a particular location in the encode PROMs 12 comtaining the relevant Huffman code and the output from the encode PROMs 12 comprises a Huffman codeword which is latched in parallel into two 8-bit shift registers 13, 14 (providing these are "empty") and a 4 bit word indicating the length of the codeword generated which is passed to an output counter 15.

For example, if the encode latch 11 held a data portion "111" to be coded as a make-up codeword, the Huffman codeword produced and latched into the output registers 13, 14 will be "0000000001" while the codeword length passed to the output counter 15 will be "1010".

The control logic 2 then causes the codeword stored in the registers 13, 14 to be serially shifted out of the registers, the number of shifts being determined by decrementing the output counter 15 from a maximum value corresponding to the codeword length supplied to the counter by the encode PROMs 12. This serial data is then transmitted directly to the processing apparatus such as another DATRAX 760 (which will normally be at a remote position) or it may simply be stored.

If the control logic 2 detects that an end of a block of runs has been reached it causes the control logic 2 to output a codeword representing make-up zero.

It may be appreciated that the circuit described so far is readily adaptable for use with code systems having more than one modifier and this is particularly useful where predictive encoding techniques have been used in the generator 1. This may occur, for example, when more than one prediction algorithm is used to suit different circumstances, a separate Huffman code system being associated with each algorithm and having a different modifier. It is a simple matter to include additional modifier length data in the PROMs 9, 10 which can be selectively accessed by the modifier counter 5.

The circuit illustrated in FIG. 1 is also capable of handling modifiers from 2 to 128.

FIG. 2 illustrates a circuit for decoding codewords of the Huffman type, and particularly codewords forming the code system shown in the Table above. As will be apparent from the Table, the codewords have a variable length and are supplied in serial form along a line 20 to an eight bit input shift register 21. The codewords may have been received from a remote device such as the encoding device shown in FIG. 1 and the decoding circuit shown may be part of a DATRAX 760 system. Overall operation of the decoder is under the control of control logic 22 although connections between the contol logic 22 and a majority of the other circuit elements have been omitted for clarity.

One of the problems with decoding variable length codewords is in determining the beginning of a codeword which is wholly or partly contained in the input register 21. This problem is solved by setting a preload control latch 23 just before a new codeword is to be loaded into the input register 21. The setting of the preload control latch 23 enables the parallel input of the input register 21. The incoming data representing the codeword is also applied to the input register 21 in parallel via an inverter 24. Since the parallel input of the input register 21 is enabled the register 21 will be preloaded with the logical complement of the leading bit of the incoming codeword. Immediately thereafter i.e. after one clock cycle the preload control latch 23 is reset which in turn enables the shift input of the input register 21 and the incoming codeword is shifted in series into the input register 21 under the control of a clock generator 25.

The preloading of the input register 21 has the effect of locating the start of an incoming codeword since this will occur at the first transition between data of one type in the input register 21 and data of the complemental type.

In theory, the amount of PROM address space needed to decode Huffman codewords of up to 16 bits is about 64 K. This is unworkable in practice and the circuit illustrated in FIG. 2 provides a solution to this problem. The solution uses the fact that all codewords in the code system shown in the Table which have a length greater than 7 bits have an identical (predetermined) prefix which, in this case, is "0000000". In fact, the code system has been designed to have this property.

It should be noted that the longest codeword or portion (prefix) of a codeword which is decoded in one step is 7 bits and so the input register has a size of eight bits. This is one more than the maximum size required, to enable the detection of the start of a codeword or codeword portion (as previously described).

After each shift of data into the input register 21, the data in the register 21 is used to address a set of prefix and suffix decode PROMs 26.

In practice, the decode PROMs 26 will be programmed so that each accessible address will correspond to the contents of the input register 21 corresponding to the presence of a full valid codeword in the input register or a prefix as described below.

Initially the prefix PROMs are enabled by an input control latch 28 and addressed. If the contents of the input register 21 is recognised by the decode PROMs 26 as a prefix, the decode PROMs 26 issue an appropriate signal (PREFIX) on a line 27 to the input control latch 28. This is set accordingly which in turn sets the preload control latch 23 which enables the parallel input of the input register 21 as previously explained. The remaining portion of the incoming codeword is then shifted into the input register 21 after initial preloading with the logical complement of the leading bit and again, after each shift as controlled by the clock generator 25, the contents of the input register 21 are applied to the decode PROMs 26. In this case, however, the suffix PROMs are enabled by the setting of the input control latch 28 while the prefix PROMs are disabled. If the full suffix has not yet been shifted into the input register 21 the suffix PROMs will not detect a valid suffix and shifting will continue. Once a valid suffix is detected a corresponding output signal (VALID) will be supplied along a line 29 to the input control latch 28 which is reset and to a sequence controller 30. The resetting of the input control latch 28 stops further shifting of data into the input register 21 and enables the prefix PROMs.

The detection of a valid suffix is also accompanied by the output of a signal (M/T) indicating whether the full codeword is a make-up codeword or a terminator codeword and this is fed to a marker detect latch 31. The data corresponding to the valid codeword detected is passed in parallel from the suffix PROMs to a data register 32 and to the marker detect latch 31.

If a prefix is not detected but instead a shorter codeword is being decoded then this will be decoded immediately by the prefix PROM which will remain enabled under the control of the input control latch 28 and as with the suffix case, data corresponding to the incoming codeword will be passed to the data register 32 and to the marker detect latch 31 while a "VALID" signal will be fed to the sequence controller 30 and to the input contol 28 which will temporarily prevent any further codewords from being decoded.

Each portion of data supplied to the data register 32 will have a fixed length corresponding to the modifier length. In this case, with a modifier of 8, the modifier length will be 3. The modifier length is set in a modifier length counter 33 which is decremented by the sequence controller 30 as data in the data register 32 is serially shifted into an output register 34. While this shift is taking place the control logic 22 permits the input control latch 28 to allow the next portion of a codeword or the beginning of the next codeword to be loaded into the input register 21. After each portion of the incoming codeword has been decoded, the decoded data is shifted serially into the output register 34 until a full 16 bits are present in the output register 34. These are then shifted in parallel under the control of the control logic 22 to an output latch 35 from where the data can be fed as desired to storage or to further processing means.

The marker detect latch 31 senses for the presence of a make-up zero run length and in particular when this occurs as a first word of a run. This cannot happen in practice and is used during the encoding process to indicate the end of a block of run lengths. When such an end of block marker is detected the sequence controller 30 is disabled by the marker detect latch 31.

We claim:

1. A method of coding signals representing a stream of digital data groups for transmission or storage, wherein each said group represents a numerical quantity, said method comprising the steps of: supplying said signals to coding means, and generating at said coding means, for each said data group, a code representing said group, said code comprising one of a terminator codeword, and a terminator codeword and at least one or more make-up codewords, wherein said terminator codewords and said make-up codewords are based on at least one multiplicative modifier.

2. A method according to claim 1, wherein said codewords belong to a code system in which no short codeword forms the prefix of a longer codeword.

3. A method according to claim 1, wherein said terminator codewords and said make-up codewords are based on the same multiplicative modifier.

4. A method according to claim 1, wherein the or each multiplicative modifier is a power of two.

5. A method according to claim 1, wherein each digital data group is divided into portions corresponding to respective modifier lengths, a codeword subsequently being generated for each said portion.

6. A method according to claim 1, further comprising generating a zero make-up codeword to mark the end of a block of codewords.

7. Apparatus for coding signals representing a stream of digital data groups for transmission or storage, wherein each said group represents a numerical quantity, said apparatus comprising in combination: coding means; and means for supplying said signals to said coding means, said coding means being adapted to generate, for each data group, a code representing said group, said code comprising one of a terminator codeword, and a terminator codeword and at least one make-up codeword, wherein said terminator and make-up codewords are based on at least one multiplicative modifier.

8. Scanning apparatus having means for scanning pixels of an original image and for generating run length data in the form of digital data groups representing said pixels of said original image; and apparatus according to claim 7 for generating a code for each data group.

9. A method of decoding a series of codewords which have been coded by a method comprising the steps of: supplying signals representing a stream of digital data groups for transmission or storage, wherein each said group represents a numerical quantity, to coding means, and generating at said coding means, for each said data group, a code representing said group, said code comprising one of a terminator codeword, and a terminator codeword and at least one or more make-up codewords, wherein said terminator codewords and said make-up codewords are based on at least one multiplicative modifier, said decoding method comprising: determining whether each codeword is a terminator codeword or a make-up codeword; and generating for each terminator codeword or each terminator codeword and associated make-up codeword the corresponding digital data group, whereby signals representing said original stream of digital data groups are produced.

10. Apparatus for decoding a series of codewords which have been generated by apparatus for coding signals representing a stream of digital data groups for transmission or storage, wherein each said group represents a numerical quantity, said coding apparatus comprising in combination: coding means; and means for supplying said signals to said coding means, said coding means being adapted to generate, for each data group, a code representing said group, said code comprising one of a terminator codeword, and a terminator codeword and at least one make-up codeword, wherein said terminator and make-up codewords are based on at least one multiplicative modifier, the decoding apparatus comprising: means for receiving said codewords; means for determining whether a terminator codeword or a make-up codeword has been received; and means for generating for each terminator codeword or each terminator codeword and associated make-up codeword the corresponding digital data group, whereby signals representing said original stream of digital data groups are produced.

* * * * *